(12) United States Patent
Ranta

(10) Patent No.: US 8,421,703 B2
(45) Date of Patent: Apr. 16, 2013

(54) APPARATUS FOR ENABLING TWO ELEMENTS TO SHARE A COMMON FEED

(75) Inventor: Tero Ta Ranta, San Diego, CA (US)

(73) Assignee: Nokia Corporation, Espoo (FI)

( * ) Notice: Subject to any disclaimer, the term of this patent is extended or adjusted under 35 U.S.C. 154(b) by 795 days.

(21) Appl. No.: 12/312,564

(22) PCT Filed: Nov. 17, 2006

(86) PCT No.: PCT/IB2006/004018
§ 371 (c)(1),
(2), (4) Date: Dec. 11, 2009

(87) PCT Pub. No.: WO2008/059316
PCT Pub. Date: May 22, 2008

(65) Prior Publication Data
US 2010/0109967 A1 May 6, 2010

(51) Int. Cl.
*H01Q 21/00* (2006.01)
(52) U.S. Cl.
USPC .......................................... 343/853; 343/850
(58) Field of Classification Search .................. 343/850, 343/853
See application file for complete search history.

(56) References Cited

U.S. PATENT DOCUMENTS

| | | | | |
|---|---|---|---|---|
| 5,375,260 | A | 12/1994 | Koike | 455/208 |
| 5,898,406 | A * | 4/1999 | Matero | 343/702 |
| 6,462,716 | B1 * | 10/2002 | Kushihi | 343/860 |
| 6,903,612 | B2 | 6/2005 | Toncich et al. | 330/302 |
| 6,914,570 | B2 * | 7/2005 | Asrani et al. | 343/702 |
| 7,084,831 | B2 | 8/2006 | Takagi et al. | 343/860 |
| 7,242,364 | B2 | 7/2007 | Ranta | 343/860 |
| 7,511,681 | B2 * | 3/2009 | Bolin | 343/876 |
| 2002/0105474 | A1 * | 8/2002 | Kitamura et al. | 343/850 |
| 2002/0118075 | A1 * | 8/2002 | Ohwada et al. | 333/32 |
| 2004/0070538 | A1 * | 4/2004 | Horie et al. | 343/700 MS |
| 2005/0190107 | A1 * | 9/2005 | Takagi et al. | 343/702 |
| 2007/0069957 | A1 * | 3/2007 | Ranta | 343/700 MS |

FOREIGN PATENT DOCUMENTS

| | | | |
|---|---|---|---|
| JP | 2003324314 A | | 11/2003 |
| JP | 2005244553 | | 9/2005 |
| JP | 2008116283 A | | 5/2008 |
| WO | WO 2004/047220 A1 | | 6/2004 |

OTHER PUBLICATIONS

Joseph J. Car, "Secrets of RF Circuit Design", 1991, TAB Books, a division of McGraw-Hill, Inc., pp. 11-2-11-4.
George L. Matthaei, "Microwave Filters, Impedance-Matching Networks, and Coupling Structures", Artech House Books, Dedham, MA pp. 11-10-11-11, Date N/A.
Kim, Jungki et al., "RF Circuit Design", Wooshin books, 1999, pp. 54, 56, 70.

* cited by examiner

*Primary Examiner* — Jason M Crawford
(74) *Attorney, Agent, or Firm* — Harrington & Smith

(57) ABSTRACT

An apparatus including a first antenna element operable at least one frequency within a first frequency range; a second antenna element operable at at least one frequency within a second frequency range; radio frequency circuitry electrically connected to the first antenna element via a first electrical path and electrically connected to the second antenna element via a second electrical path, wherein the first and second electrical paths are common where they connect to the radio frequency circuitry; a first frequency-dependent filter arrangement, within the first electrical path, arranged to accept frequencies within the first frequency range and reject frequencies within the second frequency range; a first impedance level transformation arrangement, having a first tapped inductor, within the first electrical path; and a second frequency-dependent filter arrangement, within the second electrical path, arranged to accept frequencies within the second frequency range and reject frequencies within the first frequency range.

20 Claims, 3 Drawing Sheets

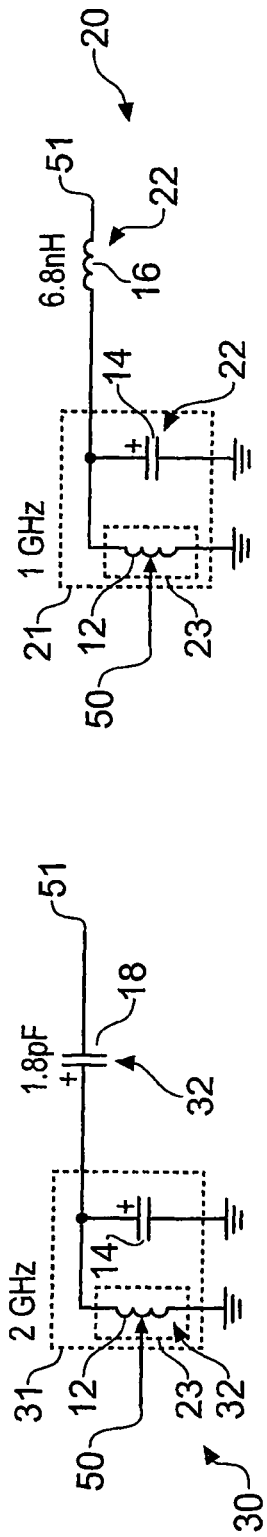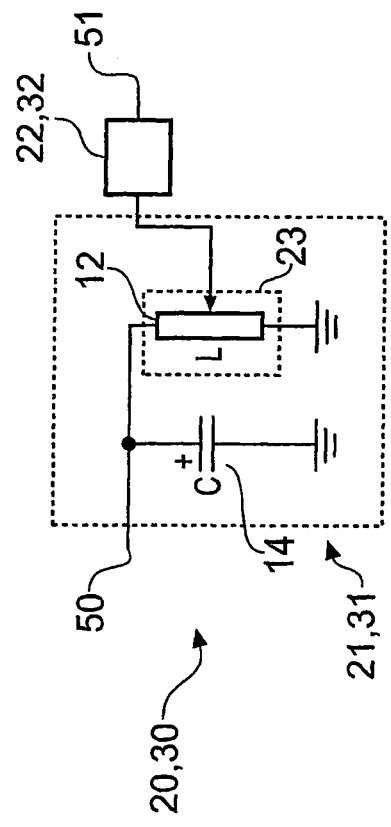
Fig. 4A
Fig. 4B
Fig. 5

APPARATUS FOR ENABLING TWO ELEMENTS TO SHARE A COMMON FEED

FIELD OF THE INVENTION

Embodiments of the present invention relate to an apparatus for enabling two antenna elements to share a common feed.

BACKGROUND TO THE INVENTION

It is often desirable to reduce the size of electronic communication devices.

In mobile cellular telecommunication it may be necessary to have separate and distinct antennas and radio frequency circuitry for each radio frequency band. It may be difficult to fit all of the circuitry required for multi-band operation into a single device.

There is therefore at present considerable interest in reducing the number of components.

It would be desirable to reduce the number of components in a radio communications device and achieve multi-band operation.

BRIEF DESCRIPTION OF THE INVENTION

According to an embodiment of the present invention there is provided an apparatus comprising: a first antenna element operable at least one frequency within a first frequency range; a second antenna element operable at least one frequency within a second frequency range; radio frequency circuitry electrically connected to the first antenna element via a first electrical path and electrically connected to the second antenna element via a second electrical path, wherein the first and second electrical paths are common where they connect to the radio frequency circuitry; a first frequency-dependent filter arrangement, within the first electrical path, arranged to accept frequencies within the first frequency range and reject frequencies within the second frequency range; a first impedance level transformation arrangement, having a first tapped inductor, within the first electrical path; and a second frequency-dependent filter arrangement, within the second electrical path, arranged to accept frequencies within the second frequency range and reject frequencies within the first frequency range.

According to another embodiment of the present invention there is provided an apparatus comprising: a first element; a second element; circuitry electrically connected to the first element via a first electrical path and electrically connected to the second element via a second electrical path, wherein the first and second electrical paths are common where they connect to the circuitry; a first frequency-dependent filter arrangement, within the first electrical path, arranged to accept frequencies within a first frequency range and reject frequencies within a second frequency range; a first impedance level transformation arrangement, having a first tapped inductor, within the first electrical path; and a second frequency-dependent filter arrangement, within the second electrical path, arranged to accept frequencies within the second frequency range and reject frequencies within the first frequency range.

According to a further embodiment of the present invention there is provided an apparatus comprising: a first part for electrical connection to an antenna element; a second part for electrical connection to radio frequency circuitry; a tapped parallel resonant arrangement connected to the first part; and a frequency-dependent filter arrangement connected to the second part.

The apparatus enables the radio frequency circuitry to be connected to two different antennas that operate in different bands via a single shared feed.

This saves components compared to using separate radio frequency circuitry and feed for each antenna.

The apparatus enable the operational bandwidth of an antenna element to be increased so that an antenna can be used to communicate in a number of frequency bands rather than using a different antenna for each band. Some embodiments may have a multi-low-band antenna and/or a multi-high-band antenna.

The apparatus enables the matching of the impedance of a non 50 Ohm antenna element to the shared feed.

BRIEF DESCRIPTION OF THE DRAWINGS

For a better understanding of the present invention reference will now be made by way of example only to the accompanying drawings in which:

FIGS. 2A, 3A and 4A illustrate various alternative embodiments for the high-band bandwidth-adaptation and frequency-dependent-filter circuitry;

FIGS. 2B, 3B and 4B illustrate various alternative embodiments for the low-band bandwidth-adaptation and frequency-dependent-filter circuitry; and FIG. 5 illustrates an impedance level transformation arrangement 23.

DETAILED DESCRIPTION OF EMBODIMENTS OF THE INVENTION

Figure 1:
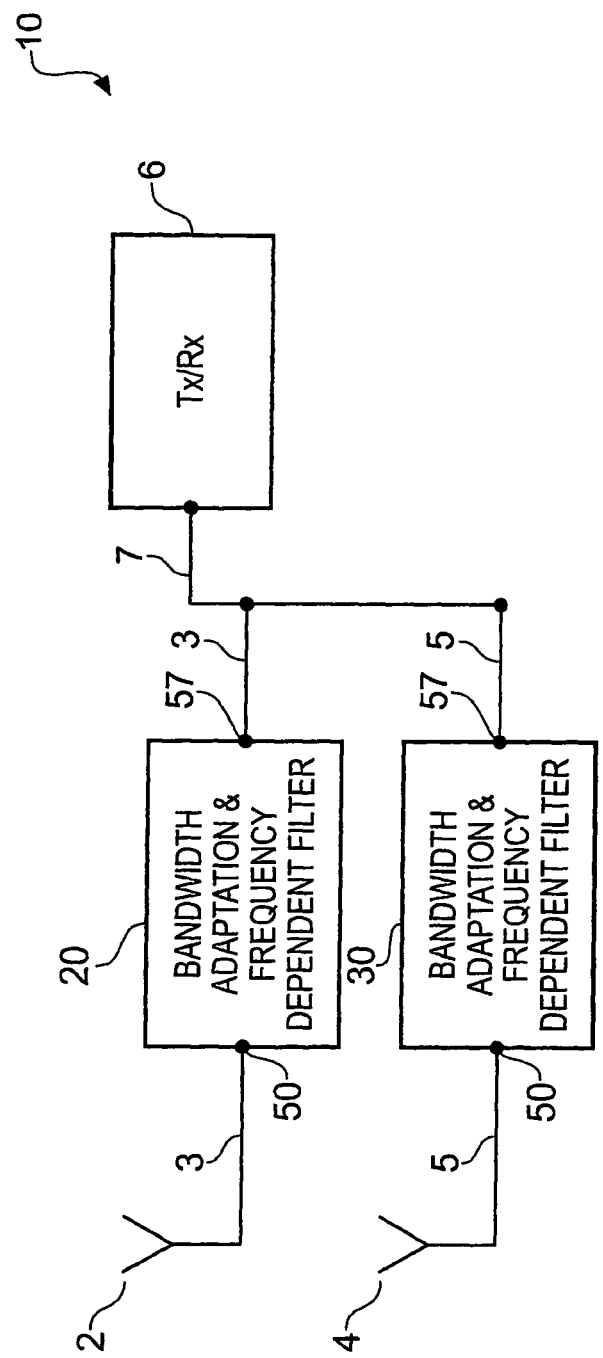
FIG. 1 schematically illustrates a radio frequency system or apparatus.

FIG. 1 schematically illustrates a radio frequency system or apparatus 10 that comprises: a first antenna element 2; a second antenna element 4; radio frequency circuitry 6; low-band bandwidth adaptation and frequency dependent filter circuitry 20; and high-band bandwidth adaptation and frequency dependent filter circuitry 20.

The system or apparatus 10 may, for example, be a mobile cellular telephone, a base station in a mobile cellular telecommunications system, a wireless communications device, a hand-portable electronic device etc or a module for use in any of the foregoing.

The first antenna element 2 in this example is operable at frequencies within a low-band frequency range of the order 1 GHz.

The first antenna element 2 is RLC series resonant at a first frequency within the low-band frequency range. The 'native' characteristics of the first antenna are adapted by circuitry 20 to broaden the antenna's operational bandwidth by, for example, introducing additional resonances. In this way, the low-band frequency range may cover one or more cellular radio frequency bands making the antenna element 2 multi-low-band. Possible low-band cellular radio frequency bands include US-GSM 850 (824-894 MHz) and EGSM 900 (880-960 MHz). In this instance the first frequency may be of the order 1 GHz.

The second antenna element 4 in this example is operable at frequencies within a high-band frequency range of the order 2 GHz that does not overlap the low-band frequency range.

The second antenna element 4 is RLC series resonant at a second frequency within the high-band frequency range. The 'native' characteristics of the second antenna are adapted by circuitry 30 to broaden the antenna's operational bandwidth by, for example, introducing additional resonances. In this way, the high-band frequency range may cover one or more cellular radio frequency bands making the second antenna element 4 multi-high-band. Possible high-band cellular radio frequency bands include PCN/DCS1800 (1710-1880 MHz); US-WCDMA1900 or PCS1900 (1850-1990 MHz); WCDMA21000 (Tx: 1920-1980 MHz Rx: 2110-2180 MHz). In this instance the second frequency may be of the order 2 GHz.

The antennas 2, 4 may be any suitable antennas or mixture of antennas such as monopoles, dipoles, loops, planar inverted L antennas (PILAs), planar inverted F antennas (PIFAs).

The use of an impedance level transformation arrangement 23 (described below) in the circuitry 20, 30 enables the use of non 50 Ohm antennas, such as low-impedance PILAs.

The radio frequency circuitry 6 may operate as a receiver, as a transmitter or as a transceiver depending upon implementations. It includes circuitry for converting a radio frequency signal to a lower frequency signal and, typically, for processing the lower frequency signal to recover information.

The radio frequency circuitry 6 is electrically connected to the first antenna element 2 via a first electrical path 3 that passes through circuitry 20 and electrically connected to the second antenna element via a second electrical path 5 that passes through circuitry 30.

The first and second electrical paths 3, 5 are common where they connect to the radio frequency circuitry at a common feed 7.

In the illustrated example, the radio frequency circuitry 6 is a transceiver. It transmits radio signals within the low-band frequency range that are transmitted by the first antenna element 2 but not by the second antenna element 4. The radio frequency circuitry 6 may be capable of transmitting using different bands within the low-band frequency range. It receives radio signals within the low-band frequency range from the first antenna element 2 but not the second antenna element 4. The radio frequency circuitry 6 may be capable of receiving at different bands within the low-band frequency range.

The transceiver also transmits radio signals within the high-band frequency range that are transmitted by the second antenna element 4 but not by the first antenna element 2. The radio frequency circuitry 6 may be capable of transmitting using different bands within the high-band frequency range. It receives radio signals within the high-band frequency range from the second antenna element 4 but not the first antenna element 2. The radio frequency circuitry 6 may be capable of receiving at different bands within the high-band frequency range.

Figure 2A:
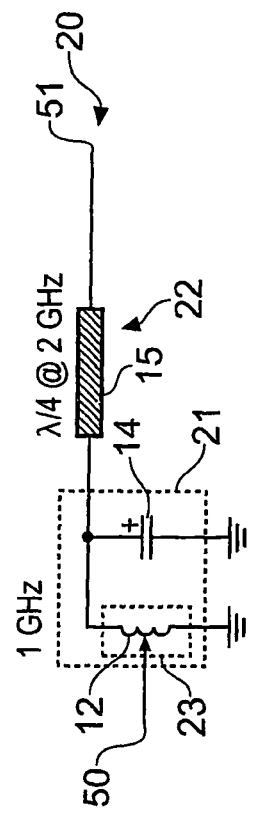
Figure 3A:
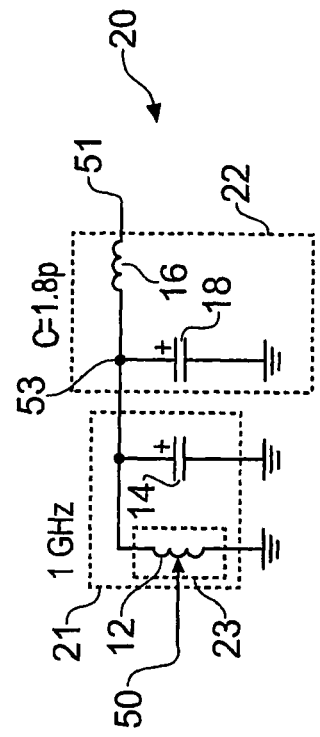

FIGS. 2A, 3A and 4A illustrate various alternative embodiments for the high-band bandwidth adaptation and frequency dependent filter circuitry 30. In the illustrated figures the high-band circuitry 20 comprises an arrangement of reactive components defining a high-band parallel resonant arrangement 31 and a high-band frequency-dependent filter arrangement 32.

Figure 2B:
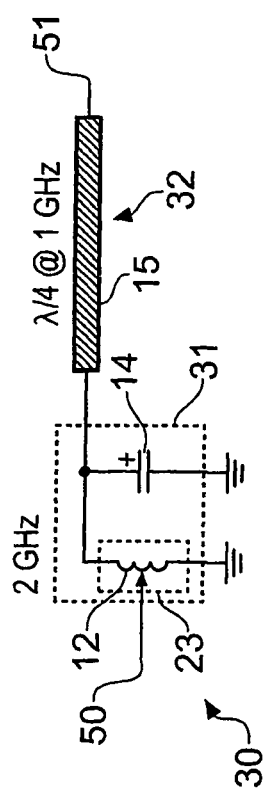
Figure 3B:
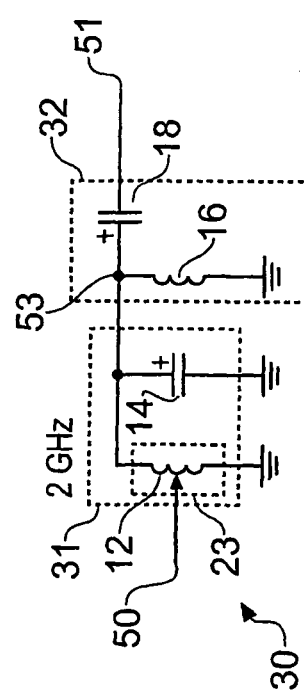

FIGS. 2B, 3B and 4B illustrate various alternative embodiments for the low-band bandwidth adaptation and frequency dependent filter circuitry 20. In the illustrated figures the low-band circuitry 20 comprises an arrangement of reactive components defining a low-band parallel resonant arrangement 21 and a low-band frequency-dependent filter arrangement 22.

A particular low-band bandwidth adaptation and frequency dependent circuit 20 is typically paired with a corresponding high-band bandwidth and frequency dependent circuit 30 so that they are used simultaneously. For example, the circuits 20, 30 of FIGS. 2A and 2B may be paired, the circuits 20, of FIGS. 3A and 3B may be paired and the circuits 20, 30 of FIGS. 4A and 4B may be paired.

The high-band frequency-dependent filter arrangement 32 and the low-band frequency-dependent filter arrangement 22 of a 'pair' of circuits 20, 30 form a diplexer. The high-band frequency-dependent filter arrangement 32 and the low-band frequency-dependent filter arrangement 22 are effectively in parallel. The configuration of one therefore affects the operation of the other and this mutual dependence should be taken into account when designing a diplexer of particular impedance and frequency response.

The FIGS. 2, 3, 4 also illustrate an impedance level transformation arrangement 23 configured to connect to a low impedance antenna element 2, 4 to the 50 Ohm feed 7 of the transceiver circuitry 6 i.e. it is configured for increasing the input impedance of the antenna element. In other embodiments, where the antenna element has an impedance of the order 50 Ohms the impedance level transformation arrangement 23 is not required and may be absent. In other embodiments, where the antenna element is of higher impedance, the impedance level transformation arrangement may be reconfigured (as illustrated in FIG. 5) to decrease the input impedance of the antenna element.

Each embodiment of the bandwidth adaptation and frequency dependent filter circuitry 20, 30 comprises an arrangement of reactive components that has a first part 50 for electrical connection to an antenna element and a second part 51 for electrical connection, via the common feed 7, to radio frequency circuitry 6.

The parallel resonant arrangement 21, 31 is electrically connected to the first part 50.

It increases the frequency range at which the antenna element can efficiently operate. That is, the parallel resonant arrangement increases the operational bandwidth of the antenna element by, for example, introducing an additional resonance. The bandwidth may be defined as the region in which the insertion loss s11 is greater than 6 dB.

The parallel resonant arrangement 21, 31 comprises an inductive component 12 and a capacitive component 14 connected in electrical parallel to form a resonant LC circuit. The values of the inductive component 12 and capacitive components are chosen so that the parallel resonant arrangement has a resonant frequency in the region of the native resonant frequency of the antenna element to which the parallel resonant arrangement 21, 31 is attached.

The parallel resonant arrangement 21, 31 converts the antenna element to a multi-band antenna.

The frequency-dependent filter arrangement 22, 32 is electrically connected to the second part 51.

The frequency-dependent filter is arranged to accept frequencies within a permitted frequency range and reject frequencies within a rejected frequency range.

The input impedance of the frequency-dependent filter is frequency dependent. It is low (of the order 50 Ohms) for the permitted frequency range so that efficient energy transfer occurs, for that frequency range, between the antenna element and the radio frequency circuitry 6. It is high (>>50 Ohms) for the rejected frequency range so that efficient energy transfer is prevented, for that frequency range, between the antenna element and the radio frequency circuitry 6.

For the low-band frequency dependent filter 21, the permitted frequency range corresponds to the low-band frequency range and the rejected frequency range corresponds to the high-band frequency range. For, the high-band frequency dependent filter 31, the permitted frequency range corresponds to the high-band frequency range and the rejected frequency range corresponds to the low-band frequency range.

In the embodiments of FIGS. 2A and 2B, the frequency dependent filtering arrangement 32, 22, is a quarter wavelength 50 Ohm transmission line 15 serially connected between the parallel resonant arrangement 21 and the second part 51. At the resonant frequency corresponding to the quarter wavelength resonant mode of the transmission line 15, the transmission line has a very large input impedance. However, at a harmonic of sub-harmonic of that resonant frequency the input impedance will be considerably less. The quarter wave length transmission line 22 is therefore chosen so that its resonant frequency corresponds with the rejected frequency range.

In the example of FIG. 2B, the low-band frequency dependent filter 22 is a 50 Ohm transmission line 15 that has a length that corresponds to a quarter wavelength of the rejected frequency range i.e. 2 GHz.

In the example of FIG. 2A, the high-band frequency dependent filter 32 is a 50 Ohm transmission line 15 that has a length that corresponds to a quarter wavelength of the rejected frequency range i.e. 1 GHz.

A transmission line 15 may be modeled as a distributed LC circuit (a RLC circuit if lossy). A transmission line is therefore simultaneously both a capacitive and inductive component.

In the embodiments of FIGS. 3A and 3B, the distributed LC circuit provided by the transmission line 15 has been replaced by a frequency dependent filter 32 that comprises a discrete inductive component (inductor 16) and a discrete capacitive component (capacitor 18).

In the example of FIG. 3B, the low-band frequency dependent filter 22 comprises an inductor 16 connected in series between a node 53 (connected to the parallel resonant arrangement) and the second part 51 and a capacitor 18 connected between the node 53 and ground. The capacitor 18 provides a path to ground for the high-band rejected frequency range.

In the example of FIG. 3A, the low-band frequency dependent filter 32 comprises a capacitor 18 connected in series between a node 53 connected to the parallel resonant arrangement 31 and the second part 51 and an inductor 16 connected between the node 53 and ground. The inductor 16 provides a path to ground for the rejected low-band frequency range.

In the example of FIG. 4B, the capacitors 14 and 18 illustrated in FIG. 3B have been combined into a single component capacitor 14. In FIG. 4B, the capacitor 14 is therefore a shared component and is used by both the frequency-dependent filter 22 and the parallel resonant circuit 21. The combination of the capacitors reduces the order of the circuitry 20.

In the example of FIG. 4A, the inductors 12 and 16 illustrated in FIG. 3A have been combined into a single component—inductor 12. In FIG. 4A, the inductor 12 is therefore a shared component and is used by both the frequency-dependent filter 32 and the parallel resonant circuit 31. The combination of the inductors reduces the order of the circuitry 20.

It should be noticed that in each of the embodiments of the low-band circuitry 20 and high-band circuitry 30, a reactive component is series connected to the second part 51. The reactive component may be a transmission line, a capacitor or an inductor in the illustrated examples.

In some embodiments, the low-band circuitry and/or the high-band circuitry may include an impedance level transformation arrangement 23. This is used to match a non 50 Ohm impedance antenna 2, 4 with the common feed 7.

Impedance level transformation, could in some embodiments be achieved using a n:m transformer (not illustrated).

In other embodiments, it is achieved by sharing components between the impedance level transformation arrangement 23 and the parallel resonant arrangement 21. For example, by tapping the parallel resonant arrangement 21, 31 and, in particular, its inductor 12.

In the examples illustrated in FIGS. 2, 3, 4, the low-band circuitry 20 and high-band circuitry 30 are arranged for connection to respective low impedance antennas 2, 4 such as PILAs. The first part 51 that connects to the antenna element is connected to the central tap of the inductor 12.

If the antenna were a high impedance antenna then instead of the tap on the inductor being electrically connected to the antenna element it would be electrically connected to the radio frequency circuitry 6 via the second part 51 as illustrated in FIG. 5.

Although embodiments of the present invention have been described in the preceding paragraphs with reference to various examples, it should be appreciated that modifications to the examples given can be made without departing from the scope of the invention as claimed.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. An apparatus comprising:
a first antenna element operable at at least one frequency within a first frequency range;
a second antenna element operable at at least one frequency within a second frequency range;
radio frequency circuitry electrically connected to the first antenna element via a first electrical path and electrically connected to the second antenna element via a second electrical path, wherein the first and second electrical paths are common where they connect to the radio frequency circuitry;
a first frequency-dependent filter arrangement, within the first electrical path, arranged to accept frequencies within the first frequency range and reject frequencies within the second frequency range;
a first impedance level transformation arrangement, having a first inductor, within the first electrical path, wherein the first inductor is shared with a first parallel resonant arrangement, within the first electrical path, for increasing the operational bandwidth of the first antenna element; and
a second frequency-dependent filter arrangement, within the second electrical path, arranged to accept frequencies within the second frequency range and reject frequencies within the first frequency range.

2. An apparatus as claimed in claim 1, wherein the first tapped inductor is shared with a first parallel resonant arrangement, within the first electrical path, for increasing the operational bandwidth of the first antenna element.

3. An apparatus as claimed in claim 1, wherein the first frequency-dependent filter arrangement and the first parallel resonant arrangement share at least one reactive component.

4. An apparatus as claimed in claim 1, wherein the first inductor is a tapped inductor and a tap of the first inductor is connected to the first or second antenna element.

5. An apparatus as claimed in claim 1, wherein the first inductor is a tapped inductor and a tap of the first inductor is connected to a reactive component of the first frequency dependent filter arrangement.

6. An apparatus as claimed in claim 1, further comprising a second impedance level transformation arrangement, having a second inductor, within the second electrical path.

7. An apparatus as claimed in claim 6, wherein the second inductor is shared with a second parallel resonant arrangement, within the second electrical path, for increasing the operational bandwidth of the second antenna element.

8. A portable electronic device comprising an apparatus as claimed in claim 1.

9. An apparatus as claimed in claim 1, wherein the operational bandwidth includes 824 to 960 MHz but not 1710 to 2180 MHz.

10. An apparatus as claimed in claim 1, wherein the operational bandwidth includes 1710 to 2180 MHz but not 824 to 960 MHz.

11. An apparatus as claimed in claim 1, wherein the parallel resonant arrangement includes an LC parallel circuit comprising the first inductor.

12. An apparatus as claimed in claim 1, wherein the frequency-dependent filter arrangement includes a reactive component in series connection with a second part for electrical connection to the radio frequency circuitry.

13. An apparatus as claimed in claim 1, wherein the frequency-dependent filter shares at least one reactive component with the parallel resonant arrangement.

14. An apparatus as claimed in claim 1, wherein the frequency-dependent filter has at least one reactive component that is not shared with the parallel resonant arrangement.

15. An apparatus as claimed in claim 1, comprising an impedance level transformation arrangement provided by a component shared with the parallel resonant arrangement wherein the shared component is a tapped inductor.

16. An apparatus as claimed in claim 1, wherein a common feed is defined where the first and second electrical paths are common, and wherein the common feed comprises an input impedance of substantially 50 Ohm.

17. An apparatus as claimed in claim 1, wherein at least one of the first antenna element and the second antenna element comprises a non-50 Ohm antenna.

18. An apparatus as claimed in claim 1, wherein the first parallel resonant arrangement is configured to have a resonant frequency in the region of a native frequency of the first antenna element.

19. An apparatus comprising:
a first element;
a second element;
circuitry electrically connected to the first element via a first electrical path and electrically connected to the second element via a second electrical path, wherein the first and second electrical paths are common where they connect to the circuitry;
a first frequency-dependent filter arrangement, within the first electrical path, arranged to accept frequencies within a first frequency range and reject frequencies within a second frequency range;
a first impedance level transformation arrangement, having a first inductor, within the first electrical path, wherein the first inductor is shared with a first parallel resonant arrangement within the first electrical path; and
a second frequency-dependent filter arrangement, within the second electrical path, arranged to accept frequencies within the second frequency range and reject frequencies within the first frequency range.

20. A portable electronic device comprising an apparatus as claimed in claim 19.

* * * * *